(12) United States Patent
Fompeyrine et al.

(10) Patent No.: US 10,727,404 B1
(45) Date of Patent: Jul. 28, 2020

(54) TUNABLE RESISTIVE ELEMENT

(71) Applicant: International Business Machines Corporation, Armonk, NY (US)

(72) Inventors: Jean Fompeyrine, Waedenswil (CH); Youri Popoff, Zurich (CH); Stefan Abel, Zurich (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/255,085

(22) Filed: Jan. 23, 2019

(51) Int. Cl.
| | | |
|---|---|---|
| G11C 11/00 | (2006.01) |
| H01L 45/00 | (2006.01) |
| G11C 13/00 | (2006.01) |
| G11C 11/22 | (2006.01) |
| H01L 27/115 | (2017.01) |
| G06N 3/063 | (2006.01) |
| H01L 41/187 | (2006.01) |

(52) U.S. Cl.
CPC ....... *H01L 45/1253* (2013.01); *G06N 3/0635* (2013.01); *G11C 11/2273* (2013.01); *G11C 11/2275* (2013.01); *G11C 11/2277* (2013.01); *G11C 13/004* (2013.01); *G11C 13/0004* (2013.01); *G11C 13/0064* (2013.01); *G11C 13/0069* (2013.01); *H01L 27/115* (2013.01); *H01L 45/06* (2013.01); *H01L 41/1876* (2013.01); *H01L 45/141* (2013.01); *H01L 45/145* (2013.01)

(58) Field of Classification Search
CPC ... H01L 45/1253; H01L 45/06; H01L 27/115; G11C 11/2273; G11C 11/2275; G11C 13/004; G11C 13/0069
See application file for complete search history.

(56) References Cited

U.S. PATENT DOCUMENTS

| | | |
|---|---|---|
| 8,159,854 B2 | 4/2012 | Elmegreen et al. |
| 8,275,727 B2 | 9/2012 | Elmegreen et al. |
| 9,058,868 B2 | 6/2015 | Elmegreen et al. |
| 9,472,368 B2 | 10/2016 | Copel et al. |

(Continued)

FOREIGN PATENT DOCUMENTS

GB 2532086 A 5/2016

OTHER PUBLICATIONS

Sun, Yihui, et al., Bioinspired Tribotronic Resistive Switching Memory for Self-Powered Memorizing Mechanical Stimuli, ACS, Appl. Mater. Interfaces, 2017, pp. 43822-43829.

(Continued)

*Primary Examiner* — Toan K Le
(74) *Attorney, Agent, or Firm* — Harrington & Smith

(57) ABSTRACT

A tunable resistive element includes a first terminal, a second terminal and a resistive layer having a tunable resistive material. The resistive layer is arranged between the first terminal and the second terminal. The resistive element further includes a piezoelectric layer having a piezoelectric material. The piezoelectric layer is adapted to apply stress to the resistive layer. An electrical resistance of the tunable resistive material is dependent upon a first electrical control signal applied to the first terminal and the second terminal as well as upon the stress applied by the piezoelectric layer to the resistive layer. The stress applied by the piezoelectric layer is dependent on a second electrical control signal applied to the piezoelectric layer.

20 Claims, 6 Drawing Sheets

(56) References Cited

U.S. PATENT DOCUMENTS

| 9,520,445 | B2 | 12/2016 | Schmidt et al. | |
|---|---|---|---|---|
| 2010/0080047 | A1* | 4/2010 | Liu ..................... | B82Y 25/00 |
| | | | | 365/157 |
| 2010/0080048 | A1* | 4/2010 | Liu ..................... | G11C 11/16 |
| | | | | 365/157 |
| 2015/0001654 | A1* | 1/2015 | Sandhu ............... | G11C 11/1659 |
| | | | | 257/421 |
| 2016/0197263 | A1* | 7/2016 | Hu ...................... | H01L 43/02 |
| | | | | 365/158 |
| 2018/0012123 | A1 | 1/2018 | Han et al. | |
| 2019/0189311 | A1* | 6/2019 | Abel .................. | G11C 13/0007 |

OTHER PUBLICATIONS

Das, Saptarshi, Two Dimensional Electrostrictive Field Effect Transistor (2D-EFET): A Sub-60MV/Decade Steep Slope Device With High on Current, Scientific Reports, Jul. 13, 2016, 7 pgs.

Beck, A. et al., "Reproducible switching effect in thin oxide films for memory applications", Appl. Phys. Lett. 77, 139 (2000) https://doi.org/10.1063/1.126902, Mar. 13, 2000, 4 pgs.

Waser, Rainer, et al., "Redox-Based Resistive Switching Memories—Nanoionic Mechanisms, Prospects, and Challenges", Advanced Materials, 2009, pp. 2632-2663.

Jo, Sung Hyun, et al., "Nanoscale Memristor Device as Synapse in Neuromorphic Systems", Nano Lett. 2010, pp. 1297-1301.

Yang, J. Joshua, et al., "Memristive devices for computing", Nature Nanotechnology, vol. 8, Jan. 2013, 12 pages.

Tambunan, Octolia T., et al., "Resistance switching in epitaxial SrCoO x thin films", Applied Physics Letters 105, 2014, 6 pages.

Acharya, Susant K., et al., "Epitaxial Brownmillerite Oxide Thin Films for Reliable Switching Memory", ACS Applied Materials & Interfaces, 2016, pp. 7902-7911.

Jeen, Hyoungjeen, et al., "Reversible redox reactions in an epitaxially stabilized Sr CoOx oxygen sponge", Nature Materilas, vol. 12, Nov. 2013, 7 pgs.

Lu, Qiyang, et al., "Voltage-Controlled Topotactic Phase Transition in Thin-Film SrCoOx Monitored by In Situ X-ray Diffraction", Nano Lett. 2016, pp. 1186-1193.

Dirkmann Sven, et al.,"The role of ion transport phenomena in memristive double barrier devices", Scientific Reports, Oct. 20, 2016, 12 pages.

Hansen, Mirko, et al., "Double Barrier Memristive Devices for Neuromorphic Computing", EDL, tbc, 2016, 8 pages.

Kiroshita, Kentaro, et al., "Finding Oxygen Reservoir by Using Extremely Small Text Cell Structure for Resistive Random Access Memory with Replaceable Bottom Electrode", Scientific Reports, Dec. 22, 2015, 8 pages.

* cited by examiner

TUNABLE RESISTIVE ELEMENT

BACKGROUND

The invention is notably directed to a tunable resistive element.

The invention further concerns a related device comprising tunable resistive elements, a neuromorphic network comprising tunable resistive elements and a design structure.

Nanoscale memory devices, whose resistance depends on the history of the electric signals applied, could become critical building blocks in new computing paradigms, such as brain-inspired computing and in-memory computing.

One promising example for nanoscale memory devices are phase-change memory (PCM) devices. PCM is a non-volatile solid-state memory technology that exploits the reversible, thermally-assisted switching of phase-change materials, in particular chalcogenide compounds such as GST (Germanium-Antimony-Tellurium), between states with different electrical resistance. The fundamental storage unit (the "cell") can be programmed into a number of different states, or levels, which exhibit different resistance characteristics. The programmable cell-states can be used to represent different data values, permitting storage of information.

Another one of the leading solutions is Resistive RAM (RRAM). It involves creating filaments of e.g. oxygen vacancies in dielectrics such as $HfO_2$, using a process called soft breakdown. The filaments are subsequently closed (SET) or opened (RESET) during operation. Strongly reducing metals, e.g. titanium, may be used as one of the electrodes to enhance the formation of the filament. However, the SET process is rather local and abrupt, due to the filamentary nature of the switching and the difficulty to exchange oxygen with the electrode.

Energy efficient training of Artificial Neural Networks (ANNs) using back-propagation (BP) algorithm requires dedicated hardware. The front-up approach is to run matrix operations required for BP on a matrix of resistive elements with a metal-insulator-metal structure (MIM). The ideal characteristics for the resistive elements (G vs pulses) is symmetric.

Accordingly, there is a need for further improvements of resistive elements.

SUMMARY

According to a first aspect, a tunable resistive element comprises a first terminal, a second terminal, and a resistive layer comprising a tunable resistive material. The resistive layer is arranged between the first terminal and the second terminal. The resistive element further comprises a piezoelectric layer comprising a piezoelectric material. The piezoelectric layer is adapted to apply stress to the resistive layer. An electrical resistance of the tunable resistive material is dependent upon a first electrical control, signal applied to the first terminal and the second terminal as well as upon the stress applied by the piezoelectric layer to the resistive layer. The stress applied by the piezoelectric layer is dependent on a second electrical control signal applied to the piezoelectric layer.

Further optional aspects relate to a device comprising a plurality of resistive elements according to the first aspect and a neuromorphic network comprising a plurality of resistive elements according to the first aspect as synapses.

According to a second aspect, a design structure is tangibly embodied in a machine readable medium for designing, manufacturing, or testing an integrated circuit. The design structure comprises a tunable resistive element according to the first aspect.

Additional embodiments will be described in more detail below, by way of illustrative and non-limiting examples, with reference to the accompanying drawings.

DETAILED DESCRIPTION

Figure 1:
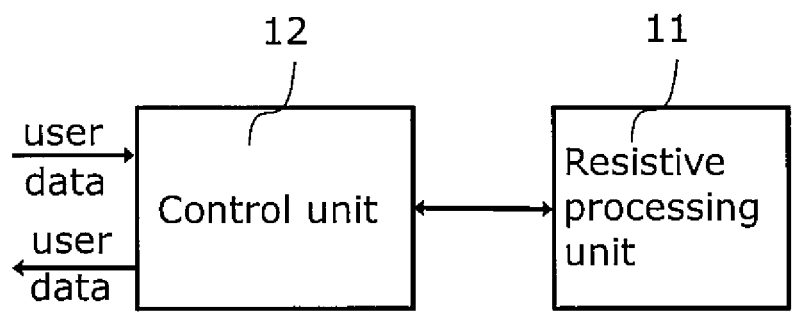
FIG. 1 illustrates a block diagram of a device according to an example embodiment.

In reference to FIGS. 1-9, some general aspects and terms of example embodiments of the invention are described.

According to embodiments of the invention, a tunable resistive material may be defined as a material whose electrical resistance can be tuned or changed by applying an electrical signal to the tunable resistive material. The electrical signal may be e.g. a current flowing through the device, or an electrical voltage applied to the tunable resistive material. The current and/or voltage may be e.g. applied to the resistive element in the form of pulses. As a result, the electrical resistance of a resistive element depends on the history of the electric signal that had been applied to the resistive memory element.

Tunable resistive materials may be in particular used as memory elements. Accordingly, resistive memory elements are based on a physical phenomenon occurring in a material that changes its resistance under action of a current or electric field. The change is usually non-volatile and reversible. Several classes of resistive memory elements are known, ranging from metal oxides to chalcogenides. Typical resistive memory elements are metal/insulator/metal structures where the metallic components serve as the electrodes and the insulator is a resistive switching material. These resistive memory elements exhibit good performance in terms of power consumption, integration density potential, retention, and endurance.

One particular promising example for resistive memory devices are resistive random-access memories (RRAM). This is a non-volatile memory technology in which the fundamental storage unit (the "cell") comprises a RRAM material located between a pair of electrodes. The RRAM material in these cells is an electrically-insulating matrix which normally presents a high resistance to electric current. Due to properties of the RRAM matrix or of the combination of matrix and electrode materials, however, it is a particular property of RRAM cells that an electrically-conductive path can be formed within the high-resistance matrix by application of a suitable electrical signal, in particular a voltage, to the electrodes. This conductive path extends through the matrix in a direction between the electrodes. The conductive path can be broken or eliminated by application of another, "RESET" signal to the electrodes, returning the cell to the high-resistance RESET state. Hence by appropriate application of SET and RESET pulses in one or more data write operation, individual cells can be programmed into states with measurably-different resistance values. The programmed cell state can be determined in a read operation using cell resistance as a metric for cell state. On application of a read voltage to the electrodes, the current which flows through the cell depends on the cell's resistance, whereby cell current can be measured to determine the cell state. The read voltage is usually significantly lower than the write voltage used for programming so that the read operation does not disturb the programmed cell state.

The conductive path can be formed by a number of different mechanisms in RRAM cells, in particular by a formation of filaments of oxygen vacancies in a dielectric layer.

Another example of a tunable resistive materials are phase change materials, e.g. $VO_2$. Phase change materials go from an amorphous to crystalline state as well as from a first crystal structure to a second distinct crystal structure.

Another type of tunable resistive materials that can be used according to embodiments of the invention are ferroelectric materials as used e.g. in ferroelectric RAM. According to such an embodiment a layer of a ferroelectric material is used as the layer of tunable resistive material. A ferroelectric material has a nonlinear relationship between the applied electrical field and the charge that is stored in the ferroelectric material. More particularly, a ferroelectric material shows a hysteresis loop with respect to an applied electrical field.

Embodiments of the invention apply a controlled level of stress to the tunable resistive material to enhance or depress the relative switching mechanism (diffusion, phase transition, ferroelectricity) of the resistive element. The applied stress results in a strain of the tunable resistive material. The strain state may depend in particular on the pulse sign or the resistance of the tunable resistive element.

FIG. 1 is a simplified schematic block diagram of a device 10 embodying possible examples of embodiments. The device 10 may embodied as memory device, in particular as in-memory computing device, and may include a multilevel resistive processing unit 11 for storing data in one or more integrated arrays of resistive memory elements described below. Reading and writing of data to the resistive processing unit 11 is performed by a control unit 12. Control unit 12 comprises circuitry of generally known form for programming resistive memory elements during data write operations and making read measurements for detecting element-state during data read operations. During these operations, the control unit can address individual resistive memory elements by applying appropriate control signals to an array of word and bit lines in the resistive processing unit 11. User data input to device 10 may be subjected to some form of write-processing, such as coding for error-correction purposes, before being supplied as write signal, in particular as write voltage, to the resistive processing unit 11. Similarly, read signals received from the resistive processing unit 11 may be processed by a read-processing module of the control unit 12, e.g. for code-word detection and/or error correction, to recover the original input user data.

Figure 2:
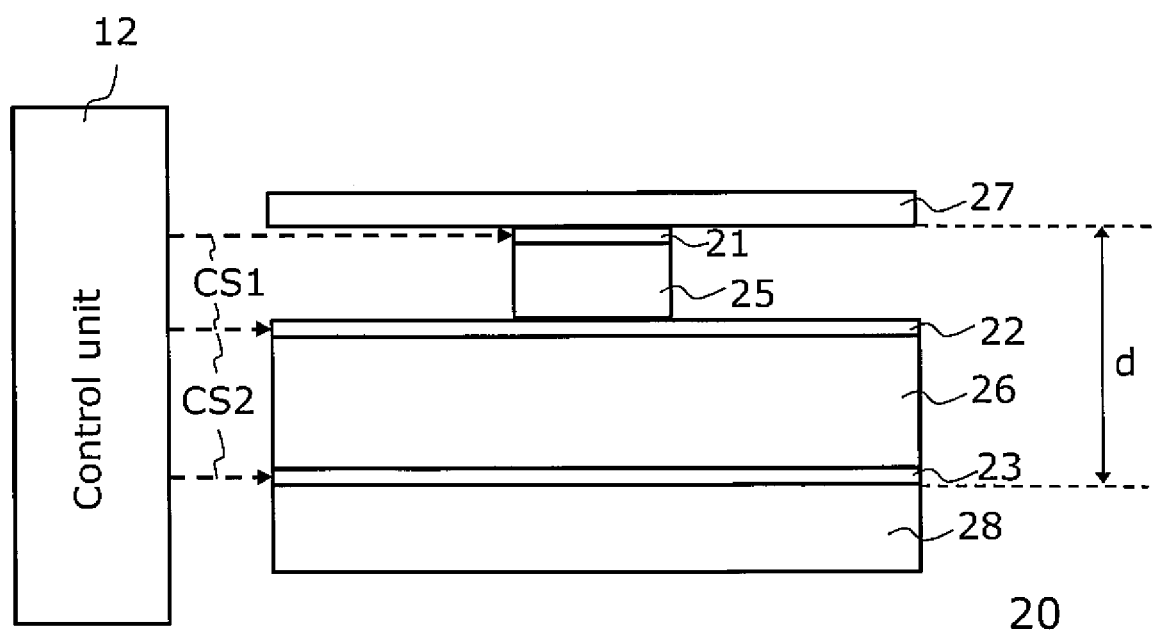
FIG. 2 shows a schematic cross sectional view of a tunable resistive element according to an example embodiment and a corresponding control unit.

FIG. 2 is a simplified cross sectional view of a tunable resistive element 20 according to another example embodiment. The tunable resistive element 20 comprises a first terminal 21, a second terminal 22, and a resistive layer 25 comprising a tunable resistive material. The resistive layer 25 is arranged between the first terminal 21 and the second terminal 22. According to embodiments, the tunable resistive material of the resistive layer 25 may be in particular a material whose electrical resistance is dependent on the stress that is applied to it.

The tunable resistive element 20 further comprises a piezoelectric layer 26 comprising a piezoelectric material. The piezoelectric layer 26 is arranged between the second terminal 22 and a third terminal 23. The piezoelectric layer 26 is adapted to apply stress to the resistive layer 25. The tunable resistive element 20 further comprises a mechanical clamping layer 27 which is arranged on top of the first terminal 21. The tunable resistive element 20 further comprises a substrate 28 which may be in particular configured as semiconductor substrate and serves as base substrate for the fabrication of the tunable resistive element 20. The resistive layer 25 and the piezoelectric layer 26 are arranged between the mechanical clamping layer 27 and the substrate 28. The mechanical clamping layer 27 is mechanically fixed to the substrate 28. More particularly, it is fixed to the substrate 28 in such a way that even upon actuation of the piezoelectric layer 26 the distance d between the substrate 28 and the mechanical clamping layer 27 remains the same or substantially the same. This allows to apply, by the piezoelectric layer 26, stress on the resistive layer 25.

The tunable resistive element 20 is coupled to a control unit 12, e.g. the control unit 12 of FIG. 1. The control unit 12 is configured to apply a first control signal CS1 and a second control signal CS2 to the resistive element 20. The first control signal CS1 is an electrical control signal and is applied to the first terminal 21 and the second terminal 22, more particularly between the first terminal 21 and the second terminal 22. The first control signal CS1 may be e.g. a voltage that is applied between the first terminal 21 and the second terminal 22.

The second control signal CS2 is also an electrical control signal and is applied between the third terminal 23 and the second terminal 22, i.e. across the piezoelectric layer 26. The second control signal CS2 may be e.g. a voltage that is applied between the third terminal 23 and the second terminal 22.

The electrical resistance R and correspondingly the electrical conductivity G of the tunable resistive material of the resistive layer 25 can be controlled by the first control signal CS1 and is hence dependent upon the first electrical control signal CS1 applied to the first terminal 21 and the second terminal 22. In addition, the electrical resistance R and correspondingly the electrical conductivity G of the tunable resistive material of the resistive layer 25 can be controlled by the second control signal CS2. More particularly, according to embodiments of the invention, stress can be applied to the resistive layer 25 by means of the second control signal CS2. The second control signal CS2 activates the piezoelectric layer 26 and thereby applies stress by means of the piezoelectric layer 26 to the resistive layer 25. The stress that is applied to the resistive layer 25 changes the electrical resistance of the resistive layer 25. Accordingly, the electrical resistance of the resistive layer 25 is not only dependent on the first control signal CS1, but also on the second electrical control signal CS2 applied to the piezoelectric layer 26. According to embodiments, the second control signal CS2 may be used in various ways to, alter/change the resistance characteristics of the resistive layer 25.

According to some embodiments, the tunable resistive material of the layer 25 may be a resistive RAM material. According to embodiments, the resistive RAM material may be in particular a dielectric material, e.g. a metal-oxide material such as $TiO_2$, $HfO_2$, $CeO_2$, $Ta_2O_5$, $WO_3$, and $RE_2O_3$, wherein RE is a rare earth material.

According to embodiments, the resistive RAM material is an ion-conducting material. According to an embodiment, the resistive RAM material is $SrCoO_3$-x. As described e.g. in the document by J. Petrie, "Strain Control of Oxygen Vacancies in Epitaxial Strontium Cobaltite Films", Advanced Functional Materials 2016, the formation and motion of oxygen vacancies and hence the resistivity of the material is dependent on the strain of the material and can hence be tuned by applying stress to it.

According to other embodiments, the tunable resistive material of the resistive layer 25 may comprise a phase change material, in particular chalcogenide compounds such as GST (Germanium-Antimony-Tellurium). Phase change materials may include other compounds of some or all elements Ge, Sb and Te, such as $Ge_2Sb_2Te_5$, GeTe, and $Ge_{15}Sb_{85}$. Such compounds may also have added constituents such as carbon, nitrogen, silicon, or silicon dioxide for instance. Other possible materials include In—Ge—Te alloys, Si—Sb—Te alloys and Si—Sb alloys.

As reported e.g. in the document by M. Xu et. al, "Pressure tunes electrical resistivity by four orders of magnitude in amorphous $Ge_2Sb_2Te_5$ phase-change memory alloy", NAS May 1, 2012. 109 (18) E1055-E1062, the resistivity of $Ge_2Sb_2Te_5$ may be tuned by the application of stress.

According to yet another embodiment, the tunable resistive material may be a ferroelectric material, e.g. a ferroelectric material that is used in ferroelectric RAM. According to such an embodiment, the ferroelectric material may be in particular lead zirconate titanate (PZT).

According to embodiments, the piezoelectric material of the piezoelectric layer may comprise PZT or PMN-PT (piezo ceramics). According to further other embodiments $BaTiO_3$ (BTO) or K and Na based materials may be used. According to yet other embodiments, materials such as AlN, and GaP may be used.

Figure 3:
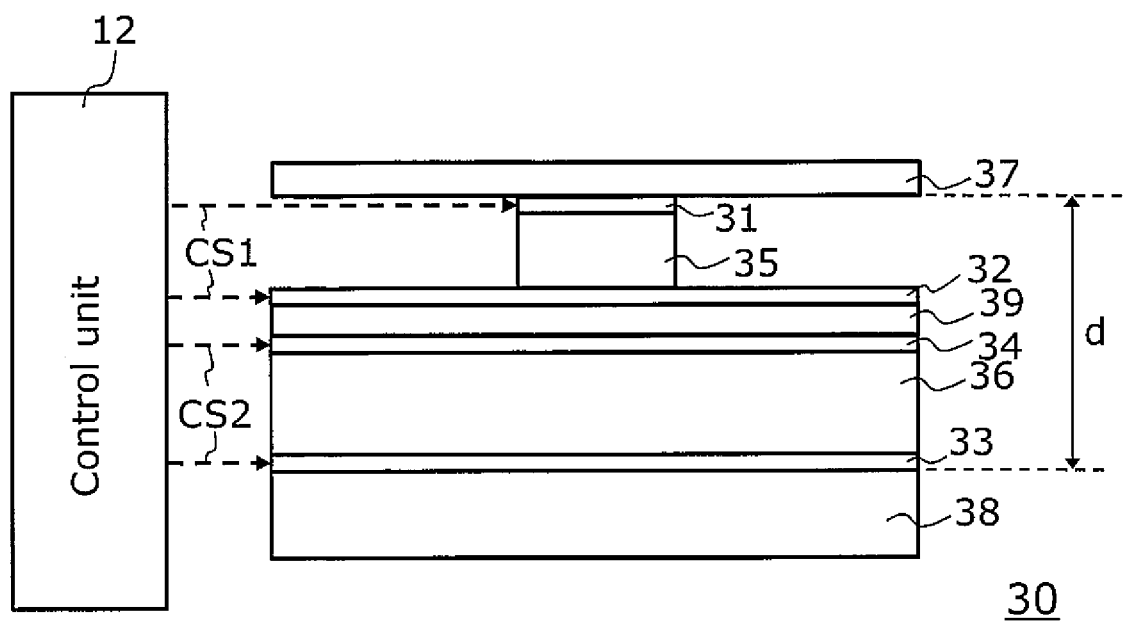
FIG. 3 shows a schematic cross sectional view of a tunable resistive element according to another example embodiment.

FIG. 3 is a simplified cross sectional view of a tunable resistive element 30 according to another example embodiment. The tunable resistive element 30 corresponds partly to the tunable resistive element 20 of FIG. 2 and comprises a first terminal 31, a second terminal 32 and a resistive layer 35 comprising a tunable resistive material. The resistive layer 35 is arranged between the first terminal 31 and the second terminal 32. The tunable resistive element 30 further comprises a piezoelectric layer 36 comprising a piezoelectric material. The piezoelectric layer 36 is also adapted to apply stress to the resistive layer 35. The resistive element 30 further comprises a third terminal 33 and a fourth terminal 34. Furthermore, a dielectric layer 39 is arranged between the second terminal 32 and the fourth terminal 34. The piezoelectric layer 36 is arranged between the third terminal 33 and the fourth terminal 34. The dielectric layer 39 provides an electrical insulation of the second terminal 32 and the fourth terminal 34.

The tunable resistive element 30 further comprises a mechanical clamping layer 37 which is arranged on top of the first terminal 31 and a substrate 38 which may be in particular configured as semiconductor substrate and serves as base substrate for the fabrication of the tunable resistive element 30. The mechanical clamping layer 37 is mechanically fixed to the substrate 38. More particularly, it is fixed to the substrate 38 in such a way that even upon actuation of the piezoelectric layer 36 the distance d between the substrate 38 and the mechanical clamping layer 37 remains the same or substantially the same. This allows to apply, by means of the piezoelectric layer 36, stress on the resistive layer 35.

The tunable resistive element 30 is also coupled to a control unit 12, e.g. the control unit 12 of FIG. 1. The control unit 12 is configured to apply a first electrical control signal CS1 and a second electrical control signal CS2 to the resistive element 30. The first control signal CS1 is applied to the first terminal 31 and the second terminal 32, more particularly between the first terminal 31 and the second terminal 32 and the second control signal CS2 is applied between the third terminal 33 and the fourth terminal 34, i.e. across the piezoelectric layer 36.

The tunable resistive material of the resistive layer 35 may be the same as the material of the resistive layer 25 as described above with reference to the embodiment of FIG. 2 and the material of the piezoelectric layer 36 may be the same as the material of the piezoelectric layer 36 as described above with reference to the embodiment of FIG. 2.

According to the embodiments, the control unit 12 of the device 10 may be configured to apply in a write mode one or more write signals, in particular write voltages, to the first terminal 21 and the second terminal 22 for writing a resistance state. In addition, the control unit 12 may apply in a read mode a read signal, in particular a read voltage, to the first terminal 21 and the second terminal 22 for reading the resistance state.

Figure 4:
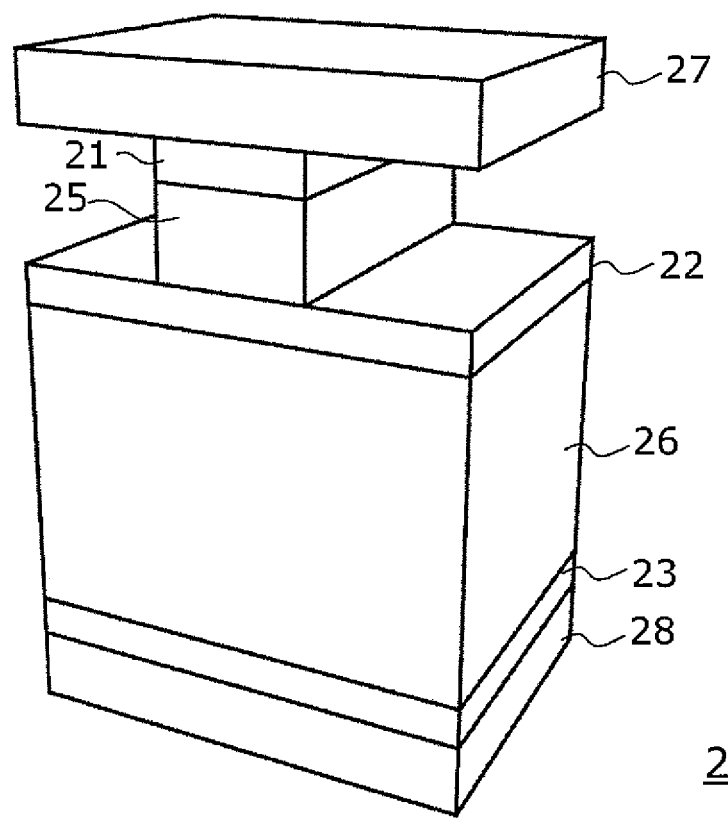
FIG. 4 shows a 3-dimensional view of the tunable resistive element according to FIG. 2.

FIG. 4 shows an exemplary embodiment of a 3-dimensional view of the tunable resistive element 20 as described with reference to FIG. 2. It should be noted that the dimensions of the 3-dimensional view of FIG. 4 are not to scale with respect to the dimensions of FIG. 2.

Figure 5:
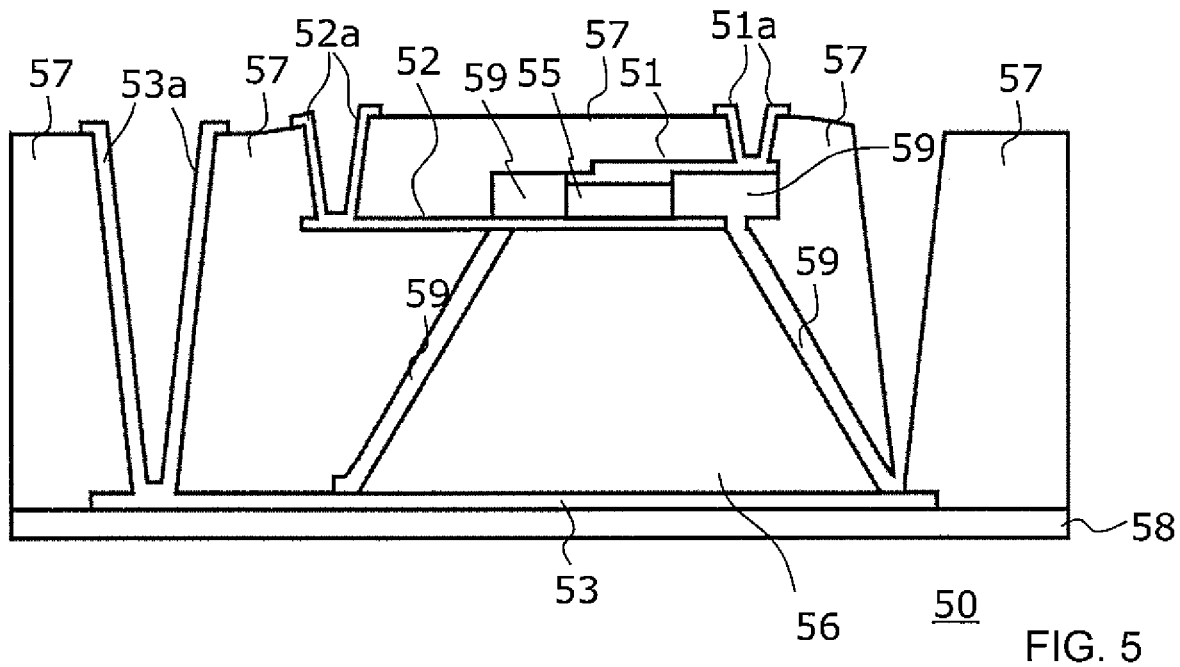
FIG. 5 shows a schematic cross sectional view of a tunable resistive element according to another example embodiment.

FIG. 5 shows an exemplary cross sectional view of a tunable resistive element 50 according to another example embodiment. The embodiment of FIG. 5 may facilitate in particular a fabrication by CMOS processing techniques.

The tunable resistive element 50 comprises a first terminal 51, a second terminal 52 and a resistive layer 55 comprising a tunable resistive material. The resistive layer 55 is arranged between the first terminal 51 and the second terminal 52.

The tunable resistive element 50 further comprises a piezoelectric layer 56 comprising a piezoelectric material. The piezoelectric layer 56 is arranged between the second terminal 52 and a third terminal 53. The piezoelectric layer 56 is adapted to apply stress to the resistive layer 55. The tunable resistive element 50 further comprises a mechanical clamping layer 57 which is embodied in a bulky form and arranged partly directly on a substrate 58 and partly on the third terminal 53. As a result, the mechanical clamping layer 57 is mechanically fixed to the substrate 58. The substrate 58 is embodied as semiconductor substrate and serves as base substrate for the fabrication of the tunable resistive element 50. The resistive layer 55 and the piezoelectric layer 56 are arranged between the mechanical clamping layer 57 and the substrate 58. More particularly, according to this embodiment, the resistive layer 55 and the piezoelectric layer 56 are embedded between the mechanical clamping layer 57 and the substrate 58 in such a way that the position of the resistive layer 55 with respect to the piezoelectric layer 58 is fixed. This facilitates the application of stress to the resistive layer 55 by means of the piezoelectric layer 58. Upon actuation of the piezoelectric layer 56 the resistive layer 55 will be squeezed/compressed due to the stress, while the vertical position of the resistive layer 55 remains unchanged or substantially unchanged. The tunable resistive element 50 comprises air portions 59 which facilitate the movement of the piezoelectric layer 56. The air portions 59 may be formed e.g. initially by a fabrication of sacrificial Si and a subsequent etching process. The substrate 58 may be in particular a Si-substrate and the clamping layer 57 may be e.g. formed of $SiO_2$. As $SiO_2$ is mechanically rather soft, the $SiO_2$ clamping layer 57 may be reinforced with e.g. $Si_3N_4$ or SiC for mechanical stability. The first terminal 51, the second terminal 52 and the third terminal 53 may be in particular embodied as metal electrodes. The first terminal 51 comprises an electrical contact 51a, the second terminal 52 comprises an electrical contact 52a and the third terminal 53 comprises an electrical contact 53a. The electrical contacts 51a, 52a and 53a are embodied as vias in the mechanical clamping layer 57.

Figure 6:
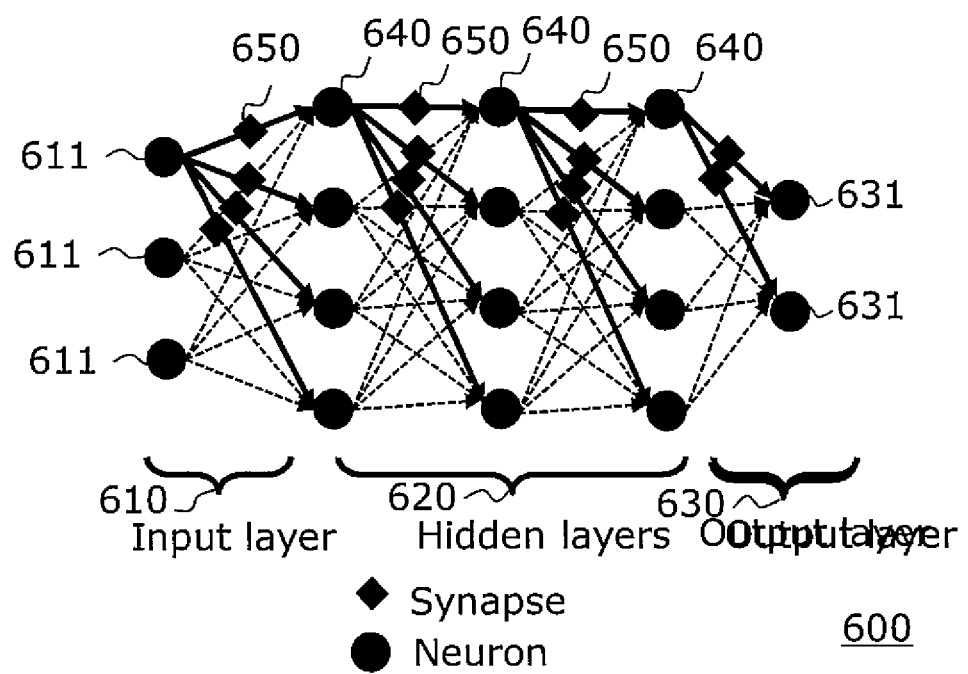
FIG. 6 shows a neural network according to an embodiment.

FIG. 6 shows a neuromorphic network 600 according to another example embodiment.

The neuromorphic network 600 comprises an input layer 610, one or more hidden layers 620 and an output layer 630. The input layer 610 comprises a plurality of input nodes 611 and the output layer 630 comprises a plurality of output nodes 631. The hidden layer 620 comprises a plurality of neurons 640 and a plurality of synapses 650. The synapses 650 may be embodied as resistive elements, e.g. as the resistive element 20, 30, 40 or 50 as described with reference to FIGS. 2, 3, 4 and 5. The tunable resistive elements according to embodiments of the invention are in particular suited to work as synapses as their resistance can be tuned by means of the second control signal to a symmetric resistance behavior as will be further illustrated below. Hence embodiments of the invention enable a symmetric change of the conductance in asymmetric resistive synapses.

The tunable resistive elements according to embodiments of the invention may be used in all kinds of neuromorphic or neural networks including e.g. feedforward neural networks, but also more complex networks such as recurrent neural networks.

The programming of the resistance states will be explained in more detail with reference to FIGS. 7a to 7c and FIGS. 8a to 8c.

Figure 7A:
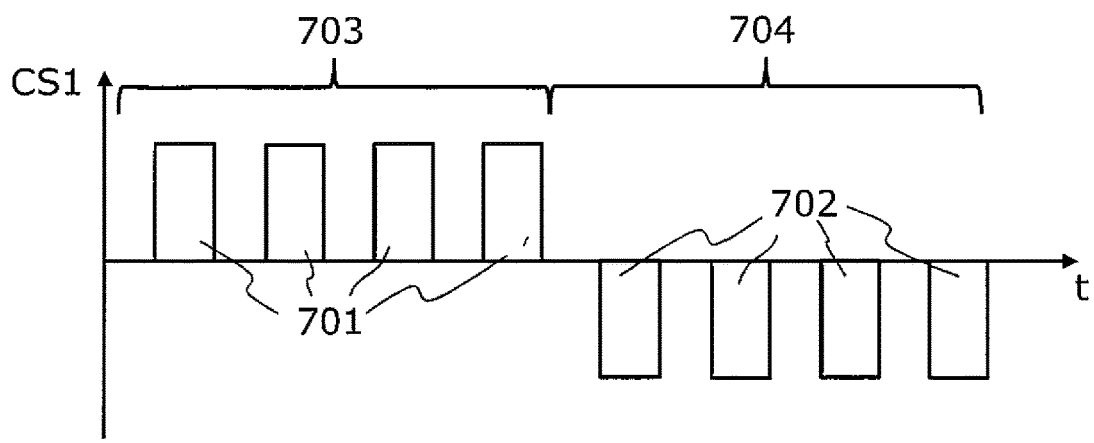
FIG. 7a illustrates a diagram of a first electrical control signal being applied to a resistive layer of a resistive element over time.
Figure 7B:
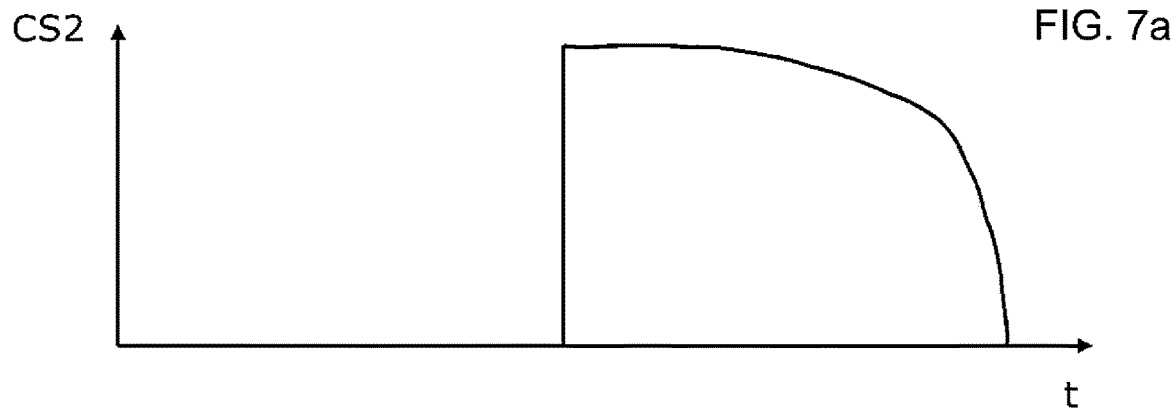
FIG. 7b illustrates a diagram of a corresponding second control signal being applied to a piezoelectric layer of the resistive element over time.
Figure 7C:
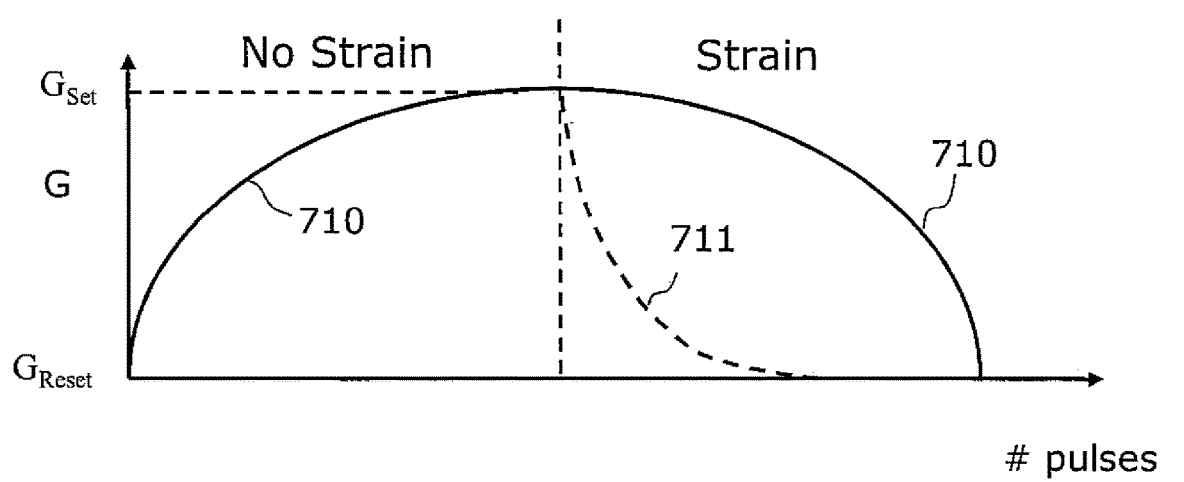
FIG. 7c illustrates a corresponding conductivity-first electrical control signal curve.

FIGS. 7a, 7b and 7c illustrate an exemplary control scheme performed by the control unit 12 for controlling the resistance of a tunable resistive element, e.g. of the tunable resistive elements 20, 30, 40 or 50 as described above.

More particularly, FIG. 7a and FIG. 7b illustrate diagrams of the first control signal CS1 and the second control signal CS2 respectively over time. The y-axis of FIG. 7a denotes the first control signal CS1 and the x-axis the time t. The y-axis of FIG. 7b denotes the second control signal CS2 and the x-axis the time t. FIG. 7c illustrates a corresponding conductivity-first electrical control signal curve which shows the electrical conductivity G of the resistive layer, e.g. the resistive layer 25 of FIG. 2, in dependence on the applied first electrical control signal CS1, wherein it is assumed that in parallel to the first electrical control signal CS1 also the second electrical control signal CS2 of FIG. 7b is applied to the resistive element.

The first electrical control signal CS1 comprises a plurality of write signals which are embodied as electrical set pulses 701 having a positive polarity and as electrical reset pulses 702 having a negative polarity. By applying the electrical set pulses 701 to the resistive elements, the electrical conductivity G may be increased. Furthermore, by applying the electrical reset pulses 702 to the resistive elements, the conductivity G may be decreased.

According to embodiments, the control unit 12 may program the resistance state of the resistive elements 20 in particular by an iterative program and verify procedure utilizing a feedback loop or closed loop.

The second electrical control signal CS2 is zero or in other words switched off during the application of the set pulses 701 in a left part 703 of the diagrams of FIG. 7a and FIG. 7b.

However, the second electrical control signal CS2 is non-zero or in other words switched on during the application of the reset pulses 702 in a right part 704 of the diagrams. According to this embodiment, the second control signal CS2 is non-constant during the application of the reset pulses and changes its value during the application of the reset pulses. More particularly, the second electrical control signal CS2 has its highest value at the first reset pulse and decreases its value with the subsequent reset pulses. According to other embodiments, the second electrical control signal CS2 may be kept constant during the application of the reset pulses. The second electrical control signals CS2 controls the stress that is applied by means of the piezoelectric layer 26 to the resistive layer 25. Accordingly, the first reset pulse is accompanied with the highest stress being applied to the resistive layer 25, while the subsequent reset pulses are accompanied with a decreasing level of stress applied to the resistive layer 25. By such an application of stress, the second electrical control signal CS2 shapes or in other words tunes the conductivity-first electrical control signal curve. More particularly, according to this example, it symmetrizes the conductivity-first control signal curve of FIG. 7c with respect to the polarity of the first control signal CS1. In this respect, the dotted curve 711 of FIG. 7c illustrates the conductivity-first electrical control signal curve without the application of the second control signal CS2. This dotted curve 711 is asymmetric with respect to the polarity of the electrical control signal CS1.

As the control unit 12 applies according to this embodiment the second control signal CS2 only on the right part 704 of the diagrams of FIGS. 7a and 7b, the second control signal CS2 depends on the polarity of the first control signal CS1. Furthermore, as illustrated in FIG. 7b, the second control signal is not constant in the right part 704 of the diagram, but depends on the resistance of the tunable resistive material. More particularly, the higher the conductance G, the higher the control signal CS2.

Figure 8A:
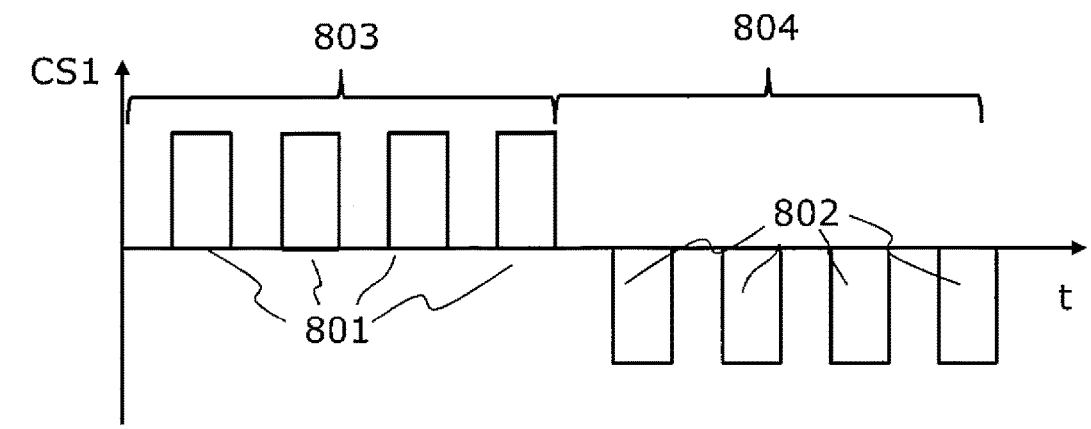
FIG. 8a illustrates another diagram of a first electrical control signal being applied to a resistive layer of a resistive element over time.
Figure 8B:
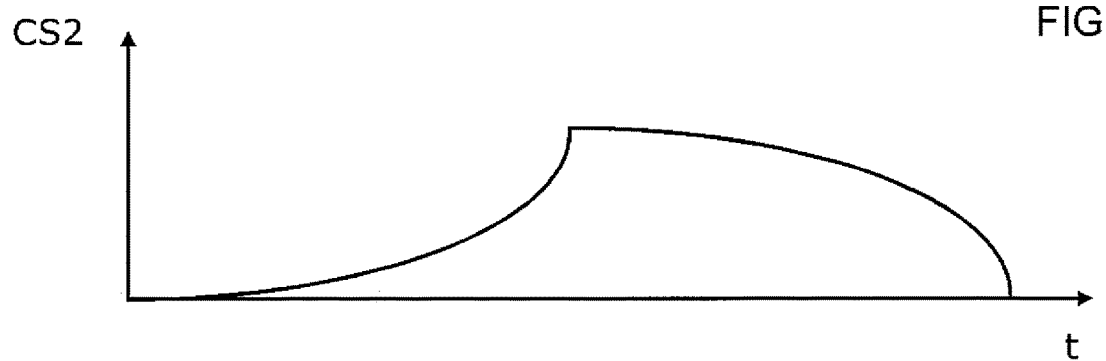
FIG. 8b illustrates a diagram of a corresponding second control signal being applied to a piezoelectric layer of the resistive element over time.
Figure 8C:
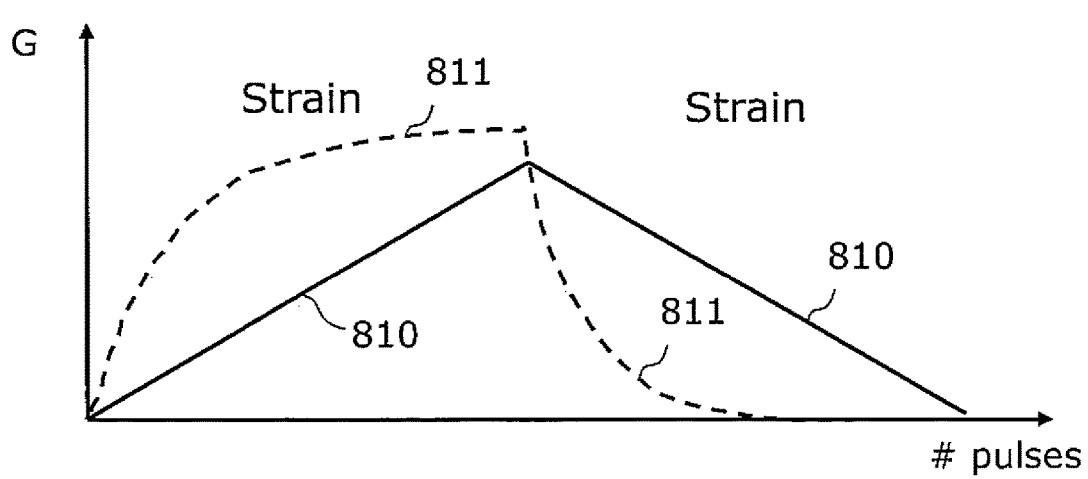
FIG. 8c illustrates a corresponding conductivity-first electrical control signal curve.

FIGS. 8a, 8b and 8c illustrate an exemplary control scheme performed by the control unit 12 for controlling the resistance of a tunable resistive element, e.g. of the tunable resistive elements 20, 30 or 50, according to another embodiment of the invention.

More particularly, FIG. 8a and FIG. 8b illustrate diagrams of the first control signal CS1 and the second control signal CS2 respectively over time. The y-axis of FIG. 8a denotes the first control signal CS1 and the x-axis the time t. The y-axis of FIG. 8b denotes the second control signal CS2 and the x-axis the time t. FIG. 8c illustrates a corresponding conductivity-first electrical control signal curve which shows the conductivity G of the resistive layer, e.g. the resistive layer 25 of FIG. 2, in dependence on the applied first electrical control signal CS1, wherein it is assumed that in parallel to the first electrical control signal CS1 also the second electrical control signal CS2 of FIG. 8b is applied to the respective resistive element in order to tune the characteristics of the conductivity-first electrical control signal curve in a desired way.

The first electrical control signal CS1 comprises a plurality of write signals which are embodied as electrical set pulses 801 having a positive polarity and as electrical reset pulses 802 having a negative polarity. By applying the electrical set pulses 801 to the resistive elements, the electrical conductivity G may be increased. Furthermore, by applying the electrical reset pulses 802 to the resistive elements, the conductivity G may be decreased.

According to the embodiment as illustrated in FIGS. 8a to 8c, the second electrical control signal CS2 is applied on a left part 803 as well as on a right part 804 of the diagram. Accordingly, the second electrical signal CS2 is applied during the application of the positive set pulses 801 as well as during the application of the negative reset pulses 802. Hence the conductivity-first electrical control signal curve 810 is tuned by the application of the second electrical control signals CS2 in the left part 803 as well as in the right part 804 of the diagram and in both the left part 803 and the right part 804 stress is applied to the resistive layer resulting in strain.

The second control signal CS2 is non-constant during the application of the set pulses 801 and during the application of the reset-pulses 802 and changes its value during the application of the set-pulses 801 and the reset-pulses 802 to fine-tune the resistance characteristic of the resistive element. More particularly, the control unit 12 is configured to straighten the resistance-first control signal curve by applying the second control signal CS2. In the left part 803 the second electrical control signal CS2 increases its value over the number of pulses/time, while in the right part 804 the second electrical control signal CS2 decreases its value over the number of pulses or time. The second electrical control signal CS2 controls the stress that is applied e.g. by means of the piezoelectric layer 26 to the resistive layer 25. Accordingly, in the left part 803 an increasing stress is applied over time, while in the right part 804 a decreasing level of stress is applied to the resistive layer over time. By such an application of stress, the second electrical control signal CS2 straightens the conductivity-first electrical control signal curve. In this respect, the dotted curve 811 of FIG. 8c illustrates the conductivity-first electrical control signal curve without the application of the second control signal CS2. This dotted curve 811 is asymmetric with respect to the polarity of the first electrical control signal CS1 due to a hysteretic behavior of the tunable resistive material, while the conductivity-first electrical control signal curve 810 with the application of the second control signal CS2 is symmetric.

It should be noted that that the FIGS. 7a, 7b and 7c as well as 8a, 8b and 8c are highly schematic and simplified to illustrate the basic principles of embodiments of the invention.

While FIGS. 7b and 8b illustrate two exemplary diagrams of the second control signal CS2, it should be noted that the respective form of the second control signal CS2 that may be chosen according to example embodiments for the respective application depends on many factors. First of all it depends on the material, more particularly, on the resistance-first electrical control signal curve of the respective tunable resistive material without the application of stress by means of the second control signal. Furthermore, it depends on the desired resistance-first electrical control signal curve of the resistive layer with the application of the second control signal CS2. This desired resistance-first electrical control signal curve depends in particular on the respective application for which the resistive element shall be used.

As an example, some tunable resistive materials, such as ferroelectric materials and resistive RAM materials, provide a hysteretic behavior. The resistance of the resistive element can be changed between a high conductivity $G_{set}$ and a low conductivity $G_{Reset}$ (see FIG. 7c).

By the application of reset pulses, the conductivity can be decreased and by the application of set pulses the conductivity can be increased.

Embodiments of the invention may provide a symmetric hysteretic behavior of the resistive elements by the application of the second control signal. This facilitates a bidirectional programming of resistance values of the resistive elements. In other words, the resistive element provides according to embodiments a substantially symmetric bidirectional resistance curve on application of the first and the second electrical control signals. Hence, embodiments of the invention may provide a continuously tunable resistor as 2-terminal device.

Figure 9:
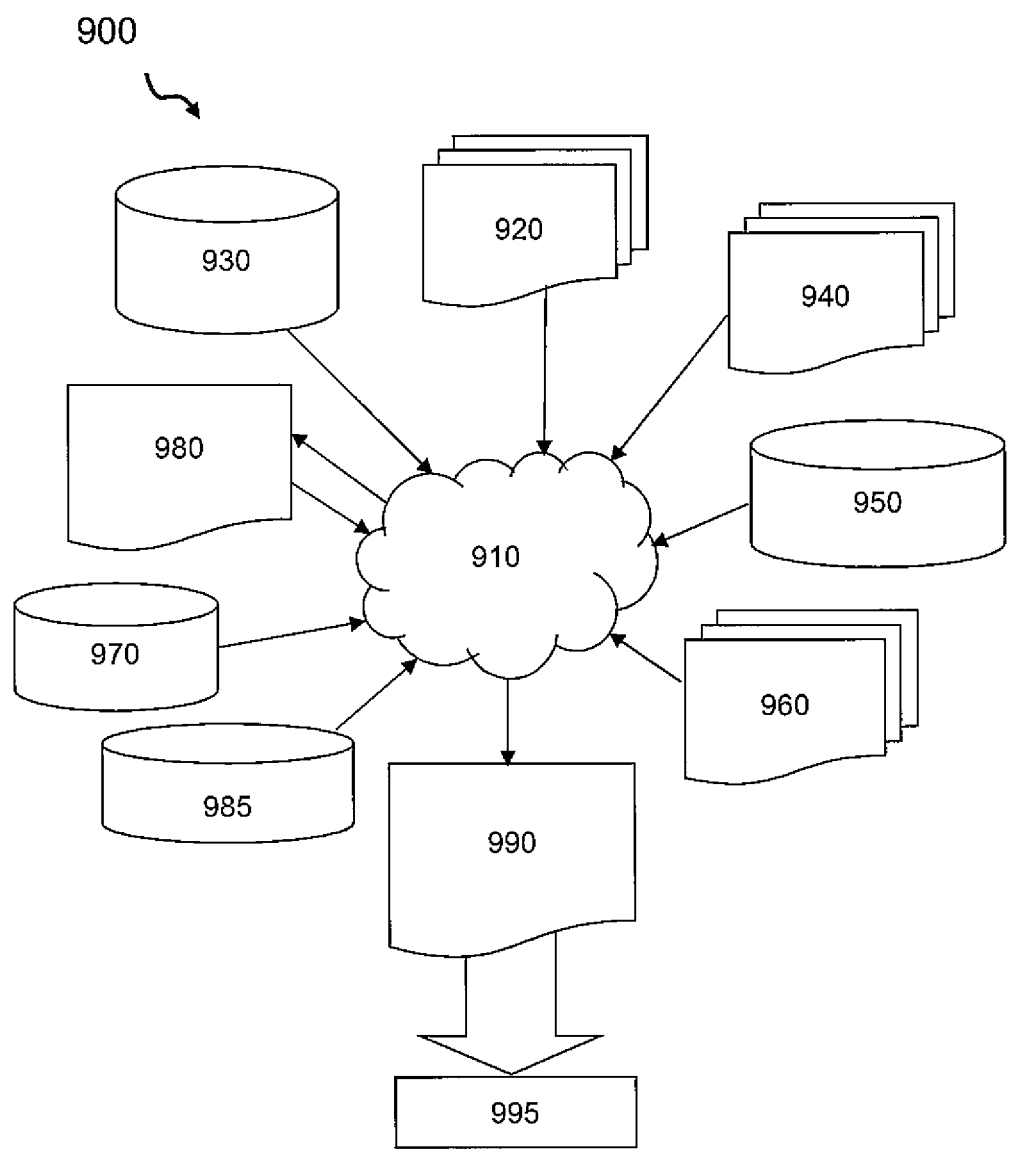
FIG. 9 shows a design structure according to an example embodiment.

FIG. 9 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown e.g. in FIGS. 1 to 5. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array. One example of a programmable gate array (PGA) or a field programmable gate array (FPGA) may be offered by Altera® Inc. or Xilinx® Inc.

FIG. 9 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1 to 5. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-5 to generate a Netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including Netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 970. Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1 to 5. In one embodiment, design structure 990 may comprise a compiled, executable HDL simulation model that functionally simulates the devices shown in FIGS. 1-5.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-5. Design structure 990 may then proceed to a stage 995 where, for example, design structure 990: proceeds to tape-out, is released to manufacturing, is released to a mask house, is sent to another design house, is sent back to the customer, etc.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In general, modifications described for one embodiment may be applied to another embodiment as appropriate.

What is claimed is:

1. A tunable resistive element comprising
a first terminal;
a second terminal;
a resistive layer comprising a tunable resistive material, the resistive layer being arranged between the first terminal and the second terminal; and
a piezoelectric layer comprising a piezoelectric material, the piezoelectric layer being adapted to apply stress to the resistive layer;
wherein an electrical resistance of the tunable resistive material is dependent upon a first electrical control signal applied to the first terminal and the second terminal as well as upon the stress applied by the piezoelectric layer to the resistive layer; and
wherein the stress applied by the piezoelectric layer is dependent on a second electrical control signal applied to the piezoelectric layer;
further comprising a mechanical clamping layer, wherein the mechanical clamping layer is adapted to fix the position of the resistive layer with respect to the piezoelectric layer to facilitate the application of stress to the resistive layer by the piezoelectric layer.

2. The tunable resistive element according to claim 1, further comprising
a substrate;
wherein the resistive layer and the piezoelectric layer are arranged between the mechanical clamping layer and the substrate; and
wherein the mechanical clamping layer is mechanically fixed to the substrate.

3. The tunable resistive element according to claim 1, further comprising
a third terminal;
wherein the piezoelectric layer is arranged between the second terminal and the third terminal; and
wherein the tunable resistive element is configured to receive the second electrical control signal between the second terminal and the third terminal.

4. The tunable resistive element according to claim 1, further comprising
a third terminal;
a fourth terminal; and
a dielectric layer arranged between the second terminal and the fourth terminal;
wherein the piezoelectric layer is arranged between the third terminal and the fourth terminal; and
wherein the tunable resistive element is configured to receive the second electrical control signal between the third terminal and the fourth terminal.

5. The tunable resistive element according to claim 1, wherein the tunable resistive material comprises a resistive RAM material.

6. The tunable resistive element according to claim 1, wherein the tunable resistive material comprises a phase change material.

7. The tunable resistive element according to claim 1, wherein the tunable resistive material comprises a ferroelectric material.

8. The tunable resistive element according to claim 1, wherein the resistive element is configured to provide a bidirectional resistance curve on application of set-pulses and reset pulses as first control signals.

9. A device comprising a plurality of tunable resistive elements according to claim 1, the device comprising a control unit configured to apply the first electrical control signal and the second electrical control signal to the plurality of tunable resistive elements.

10. The device according to claim 9, wherein the second electrical control signal is configured to shape a resistance-first electrical control signal curve, wherein the resistance-first electrical control signal curve specifies the resistance of the resistive layer in dependence on the applied first electrical control signal.

11. The device according to claim 9, wherein the control unit is configured to apply the second electrical control signal in dependence on the polarity of the first electrical control signal.

12. The device according to claim 9, wherein the control unit is configured to apply the second electrical control signal in dependence on the resistance of the tunable resistive material.

13. The device according to claim 9, wherein the control unit is configured to symmetrize the resistance-first electrical control signal curve by applying the second electrical control signal.

14. The device according to claim 9, wherein the control unit is configured to straighten the resistance-first electrical control signal curve by applying the second electrical control signal.

15. The device according to claim 9, wherein the device is a memory device and the control unit is configured to apply:
in a write mode one or more write voltages as first control signal to the first terminal and the second terminal for writing a resistance state;
one or more tuning voltages as second control signal to the piezoelectric layer for tuning the resistance state of the resistive layer; and
in a read mode a read voltage to the first and the second terminal for reading a resistance state of the resistive layer.

16. The device according to claim 9, wherein the control unit is configured to program a resistance state of the resistive elements by an iterative program and verify procedure.

17. A neuromorphic network comprising a plurality of resistive elements according to claim 1 as synapses.

18. A neuromorphic network according to claim 1, wherein the synapses are configured to provide a symmetric switching behavior.

19. A design structure tangibly embodied in a machine readable medium for designing, manufacturing, or testing an integrated circuit, the design structure comprising:
a tunable resistive element, comprising
a first terminal;
a second terminal;
a resistive layer comprising a tunable resistive material, the resistive layer being arranged between the first terminal and the second terminal; and
a piezoelectric layer comprising a piezoelectric material, the piezoelectric layer being adapted to apply stress to the resistive layer;
wherein an electrical resistance of the tunable resistive material is dependent upon a first electrical control signal applied to the first terminal and the second terminal as well as upon the stress applied by the piezoelectric layer to the resistive layer; and
wherein the stress applied by the piezoelectric layer is dependent on a second electrical control signal applied to the piezoelectric layer;

further comprising a mechanical clamping layer, wherein the mechanical clamping layer is adapted to fix the position of the resistive layer with respect to the piezoelectric layer to facilitate the application of stress to the resistive layer by the piezoelectric layer.

20. A tunable resistive element comprising
a first terminal;
a second terminal;
a resistive layer comprising a tunable resistive material, the resistive layer being arranged between the first terminal and the second terminal; and
a piezoelectric layer comprising a piezoelectric material, the piezoelectric layer being adapted to apply stress to the resistive layer;
wherein an electrical resistance of the tunable resistive material is dependent upon a first electrical control signal applied to the first terminal and the second terminal as well as upon the stress applied by the piezoelectric layer to the resistive layer; and
wherein the stress applied by the piezoelectric layer is dependent on a second electrical control signal applied to the piezoelectric layer;
further comprising,
   a third terminal;
   wherein the piezoelectric layer is arranged between the second terminal and the third terminal; and
   wherein the tunable resistive element is configured to receive the second electrical control signal between the second terminal and the third terminal.

* * * * *